(12) United States Patent
Zhang et al.

(10) Patent No.: US 12,156,351 B2
(45) Date of Patent: Nov. 26, 2024

(54) LIFTING ASSEMBLY OF ELECTRONIC EQUIPMENT, AND ELECTRONIC EQUIPMENT

(71) Applicant: AAC Acoustic Technologies (Shanghai) Co., Ltd., Shanghai (CN)

(72) Inventors: Lijin Zhang, Shenzhen (CN); Bing Xie, Shenzhen (CN); Liang Jiang, Shenzhen (CN)

(73) Assignee: AAC Acoustic Technologies (Shanghai) Co., Ltd., Shanghai (CN)

(*) Notice: Subject to any disclaimer, the term of this patent is extended or adjusted under 35 U.S.C. 154(b) by 188 days.

(21) Appl. No.: 18/090,526

(22) Filed: Dec. 29, 2022

(65) Prior Publication Data

US 2024/0074071 A1 Feb. 29, 2024

Related U.S. Application Data

(63) Continuation of application No. PCT/CN2022/119649, filed on Sep. 19, 2022.

(30) Foreign Application Priority Data

Aug. 31, 2022 (CN) .......................... 202211056134.6

(51) Int. Cl.
*H05K 5/02* (2006.01)

(52) U.S. Cl.
CPC ........ *H05K 5/0217* (2013.01); *F16B 2200/83* (2023.08)

(58) Field of Classification Search
CPC .................................................. H05K 5/0217
See application file for complete search history.

(56) References Cited

U.S. PATENT DOCUMENTS

| | | | |
|---|---|---|---|
| 2011/0122518 A1* | 5/2011 | Musha | .................... G02B 7/102 |
| | | | 359/824 |
| 2015/0109713 A1* | 4/2015 | Lee | ........................ H01H 50/60 |
| | | | 361/206 |
| 2019/0170208 A1* | 6/2019 | Liu | .................... H02K 41/0356 |

* cited by examiner

*Primary Examiner* — Sherman Ng
(74) *Attorney, Agent, or Firm* — W&G Law Group (57) ABSTRACT

The present invention provides a lifting assembly of electronic equipment, and electronic equipment. The lifting assembly includes a first mounting frame, a second mounting frame, a lifting body, a drive coil and a first magnetic element. The lifting assembly is controlled to move by means of controlling the drive coil to be powered on or powered off, thus improving the stability and reliability of the motion of the lifting assembly, reducing the risk of damage to the lifting assembly caused by manual pressing, prolonging the service life of the lifting assembly, simplifying operations of a user, and enhancing the use experience of the user.

10 Claims, 6 Drawing Sheets

LIFTING ASSEMBLY OF ELECTRONIC EQUIPMENT, AND ELECTRONIC EQUIPMENT

CROSS-REFERENCE TO RELATED APPLICATIONS

The application is a continuation of International Application No. PCT/CN2022/119649 filed on Sep. 19, 2022, which is incorporated herein by reference in its entireties.

TECHNICAL FIELD

The present invention relates to the technical field of electronic equipment, in particular to lifting assembly of electronic equipment, and electronic equipment.

BACKGROUND

Shoulder keys have been widely used in various kinds of electronic equipment. However, since solid shoulder keys are much higher than a shell of the electronic equipment, they are easily touched by mistake or affect the handfeel of the electronic equipment in daily use. Therefore, when a shoulder key is not used, the shoulder key needs to be pushed back into the electronic equipment. At present, a user pulls the shoulder key out of the electronic equipment or pushes the shoulder key into the electronic equipment, resulting in lower reliability of the shoulder key and easy damage. The user experience is poor because of manual pulling and pushing.

Therefore, it is necessary to provide a lifting assembly of electronic equipment and electronic equipment with high reliability and good use experience.

SUMMARY

The present invention aims to provide a lifting assembly of electronic equipment and electronic equipment with high reliability and good use experience.

The technical solution of the present invention is as follows: a lifting assembly of electronic equipment, the lifting assembly of the electronic equipment including a first mounting frame, a second mounting frame, a lifting body, a drive coil, and a first magnetic element, wherein the first mounting frame and the second mounting frame are oppositely arranged along a first direction, and the first mounting frame and the second mounting frame are movably connected; the lifting body is mounted on the first mounting frame; the drive coil is mounted on the second mounting frame; the first magnetic element is relatively arranged on one side of the drive coil away from the second mounting frame along an axial direction of the drive coil; after power is made to the drive coil, the drive coil drives the second mounting frame to move along the second direction under the drive of the first magnetic element; at the same time, the second mounting frame drives the first mounting frame to move along the first direction to cause the lifting body moves along the first direction; and a preset included angle exists between the first direction and the second direction.

In one possible design, the first mounting frame includes a first fixing part; the second mounting frame at least includes a first fixing fitting part and a second fixing fitting part which are spaced apart; when the lifting assembly of electronic equipment is in a stable state, the first fixing part fits the first fixing fitting part, or the first fixing part fits the second fixing fitting part.

In one possible design, the first mounting frame includes a first fixing portion, a second fixing portion, and a first fitting portion for connecting the first fixing portion with the second fixing portion; the second mounting frame includes a first fixing fitting portion, a second fixing fitting portion, and a second fitting portion for connecting the first fixing fitting portion with the second fixing fitting portion; the first fitting portion abuts against the second fitting portion; when the second mounting frame moves along the second direction, the first fitting portion and the second fitting portion move relatively to cause the first mounting frame to move along the first direction.

In one possible design, a height difference exists between the first fixing portion and the second fixing portion along the first direction; a height difference exists between the first fixing fitting portion and the second fixing fitting portion along the first direction; when the lifting assembly of electronic equipment is in the stable state, the first fixing portion abuts against the first fixing fitting portion, or the first fixing portion abuts against the second fixing fitting portion.

In one possible design, the first fixing part is arranged to the first fixing portion; the first fixing fitting part is arranged to the first fixing fitting portion; the second fixing fitting part is arranged to the second fixing fitting portion; the first fixing part fits the first fixing fitting part when the first fixing portion abuts against the first fixing fitting portion; and the first fixing part fits the second fixing fitting part when the first fixing portion abuts against the second fixing fitting portion.

In one possible design, the first mounting frame includes a first main body portion, and a first end portion and a second end portion which are oppositely arranged at two ends of the first main body portion along the second direction; the first fitting portion, the first fixing portion and the second fixing portion are all arranged at the first end portion; the second mounting frame includes a second main body portion, and a third end portion and a fourth end portion which are oppositely arranged at two ends of the second main body portion along the second direction; the second fitting portion, the first fixing fitting portion and the second fixing fitting portion are all arranged at the third end portion; along the first direction, a height difference exists between each of the first end portion and the second end portion and the first main body portion, and a height difference exists between each of the third end portion and the fourth end portion and the second main body portion; the first main body portion fits the second main body portion; when the second mounting frame moves along the second direction, the first end portion and the third end portion move relatively, and the second end portion and the fourth end portion move relatively.

In one possible design, the second end portion is provided with a third fitting portion, a third fixing portion and a fourth fixing portion; the third fixing portion is connected with the fourth fixing portion through the third fitting portion; a height difference exists between the third fixing portion and the fourth fixing portion along the first direction; the fourth end portion is provided with a fourth fitting portion, a third fixing fitting portion and a fourth fixing fitting portion; the third fixing fitting portion is connected with the fourth fixing fitting portion through the fourth fitting portion; a height difference exists between the third fixing fitting portion and the fourth fixing fitting portion along the first direction; the third fitting portion and the fourth fitting portion move relatively when the second mounting frame moves along the second direction; when the lifting assembly of electronic equipment is in the stable state, the fourth fixing portion abuts against the fourth fixing fitting portion, or the third fixing portion abuts against the fourth fixing fitting portion.

In one possible design, the first mounting frame further includes a second fixing part and a third fixing part; the second fixing part is arranged to the third fixing portion; the third fixing part is arranged to the fourth fixing portion; the second mounting frame further includes a third fixing fitting part, and the third fixing fitting part is arranged to the fourth fixing fitting portion; and when the lifting assembly of electronic equipment is in the stable state, the second fixing part fits the third fixing fitting part, or the third fixing part fits the third fixing fitting part.

In one possible design, the first fixing part, the second fixing part, the third fixing part, the first fixing fitting part, the second fixing fitting part, and the third fixing fitting part are all magnetic elements.

The present invention also provides an electronic equipment, the electronic equipment including: an equipment body; and the lifting assembly of electronic equipment according to any one of the above, wherein the lifting assembly of electronic equipment is mounted on the equipment body; the lifting assembly of electronic equipment at least partially extends out of the equipment body; and the equipment body further includes a limiting structure capable of limiting the lifting assembly of electronic equipment from moving along the first direction and/or the second direction.

The beneficial effects of the present invention lie in: the lifting assembly is controlled to move by means of controlling the drive coil to be powered on or powered off, thus improving the stability and reliability of the motion of the lifting assembly, reducing the risk of damage to the lifting assembly caused by manual pressing, prolonging the service life of the lifting assembly, simplifying operations of a user, and enhancing the use experience of the user.

DETAILED DESCRIPTION OF THE EMBODIMENTS

Figure 1:
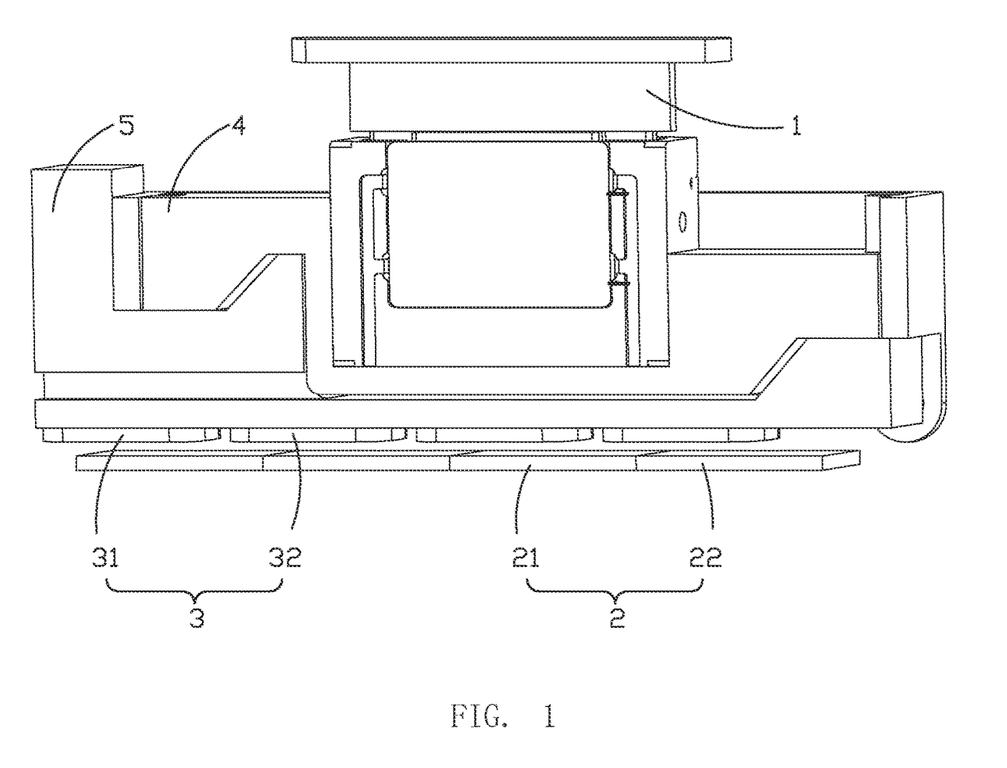
FIG. 1 is a partially schematic structural diagram of a lifting assembly of electronic equipment provided according to the present invention in one embodiment.
Figure 2:
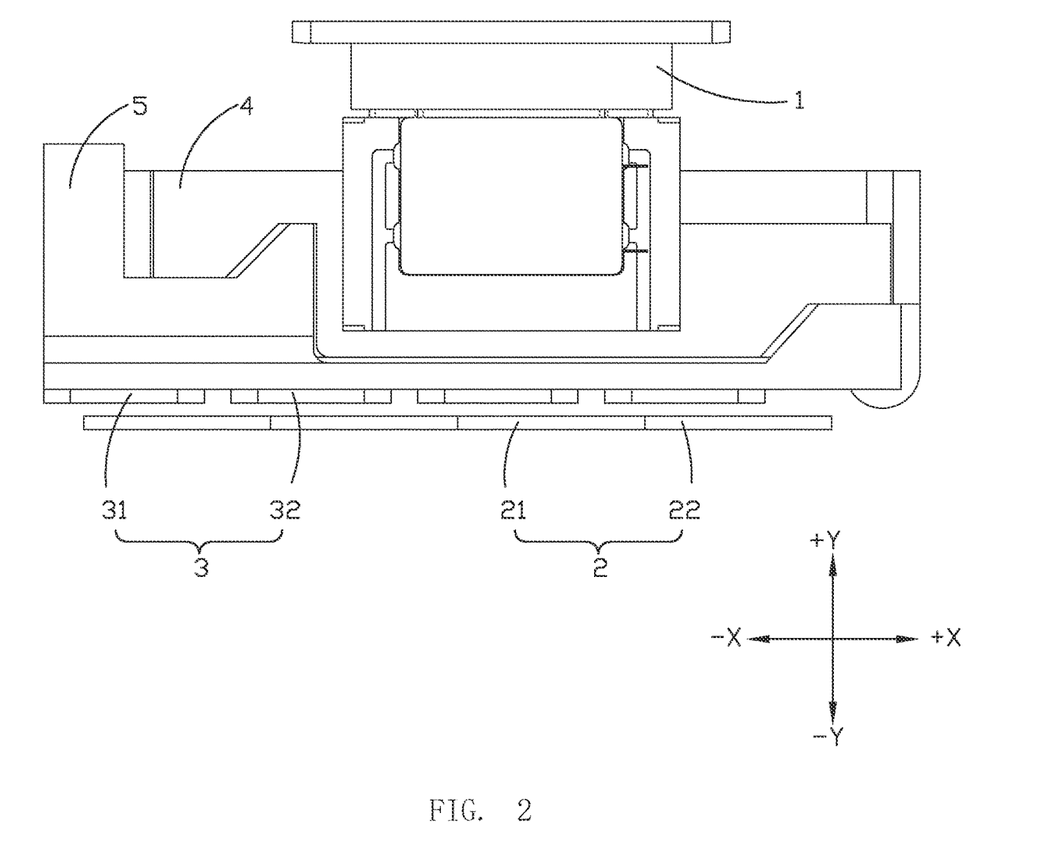
FIG. 2 is a front view of FIG. 1.

The present invention is further described below in combination with the accompanying drawings and implementations. The present invention provides electronic equipment (not shown in the figure), including an equipment body (not shown in the figure) and a lifting assembly mounted on the equipment body. As shown in FIG. 1 and FIG. 2, the lifting assembly includes a first mounting frame 4 and a second mounting frame 5 which are oppositely arranged along a first direction, a lifting body 1 mounted on the first mounting frame 4, and a drive coil 3 mounted on the second mounting frame 5. A first magnetic element 2 is arranged on one side of the drive coil 3 away from the second mounting bracket 5 along an axial direction of the drive coil (the axial direction of the drive coil is the first direction Y, which is taken as an example in the present invention). After power is made to the drive coil 3, current in the drive coil 3 can generate an Ampere force under the action of a magnetic field of the first magnetic element 2. The first magnetic element 2 is fixed on the equipment body. Therefore, the drive coil 3 can drive the second mounting frame 5 to move along a second direction X under the drive of the first magnetic element 2, and the first mounting frame 4 can drive the lifting body 1 to move along the first direction Y under the drive of the second mounting frame 5, so that the lifting body 1 at least partially extends out of or retracts into the equipment body. There is a preset included angle between the first direction Y and the second direction X. The present invention does not make special restrictions on the size of the included angle between the first direction Y and the second direction X. For the convenience of description, the included angle between the first direction Y and the second direction X is 90°, which is taken as an example below. The electronic equipment includes but is not limited to a computer, a mobile phone, a tablet, a keyboard, a camera and the like. The present invention does not specifically define the specific types of electronic equipment. The lifting body 1 includes but is not limited to a key, a motor and other structures. The present invention does not make special restrictions on the specific types of the lifting body 1.

The lifting body 1 is driven to move by the Ampere force generated by the drive coil 3 and the first magnetic element 2, which reduces the possibility of a cumbersome operation caused by a user manually pushing a key, thus simplifying user's operations and improving the use experience of the user. The relative motion between the first mounting frame 4 and the second mounting frame 5 controls the motion of the lifting body 1, thus reducing the trend of abnormal motion of the lifting body 1 to improve the stability of the lifting body 1. The lifting body 1 is mounted on the first mounting frame 4, and the drive coil 3 is mounted on the second mounting frame 5, which improves the mounting stability of the lifting body 1 and the drive coil 3, and reduces the risk of an abnormal motion state of the lifting assembly due to the fact that the lifting body 1 and the drive coil 3 deviate from the predetermined mounting positions in a working process, thus improving the working stability of the lifting assembly and the drive coil 3 and improving the working stability of the electronic equipment.

A limiting structure is arranged on the equipment body of the electronic equipment. The limiting structure can limit the motion of the first mounting frame 4 along the first direction Y, which limits the motion of the lifting body 1 along the first direction Y to reduce the risk of separation of the lifting body 1 from the equipment body, thus improving the stability of the connection between the lifting body 1 and the equipment body and improving the working stability of the lifting body 1. In addition, the limiting structure can also limit the motion of the second mounting frame 5 along the second direction X, which limits the motion of the drive coil 3 along the second direction X to reduce the risk of interference between the drive coil 3 and other parts in the electronic equipment, thus improving the working stability of the drive coil 3 and other parts in the electronic equipment and prolonging the service lives of the drive coil 3 and other parts in the electronic equipment.

The electronic equipment is provided with a control assembly which is used for controlling the drive coil 3 to be powered on or powered off, so as to control the working state of the lifting assembly. The control assembly includes a control terminal and a circuit board assembly. The control terminal is in electrical or signal connection with the circuit board assembly. The user can input a control command to the control terminal. The control terminal controls the drive coil 3 to be powered on or powered off through the circuit board assembly according to the received command. Setting the control terminal can further simplify user's operation, improve the use experience of the user, and further improve the use performance of the electronic equipment.

Figure 3:
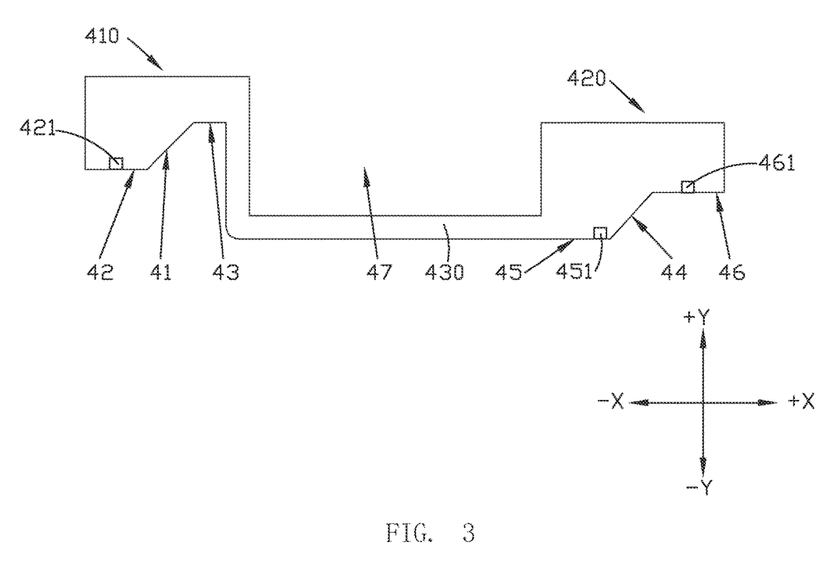
FIG. 3 is a schematic structural diagram of a first mounting frame in FIG. 2.

The control terminal can be application software, a gesture command, a voice command, a Bluetooth command, etc. in the electronic equipment. The present invention does not make special restrictions on the specific structures and types of the control terminal and the control assembly As shown in FIG. 3, the first mounting frame 4 is provided with a mounting slot 47, and the lifting body 1 is mounted in the mounting slot 47, so as to simplify connection structures between the lifting body 1 and the first mounting frame 4, thereby reducing the production cost of the lifting body 1 and the first mounting frame 4. The connection ways for the lifting body 1 and the mounting slot 47 include but are not limited to bonding, welding, and fixed connection through screws, bolts and other fasteners. The present invention does not make specific restrictions on the specific mounting way of the lifting body 1.

Figure 4:
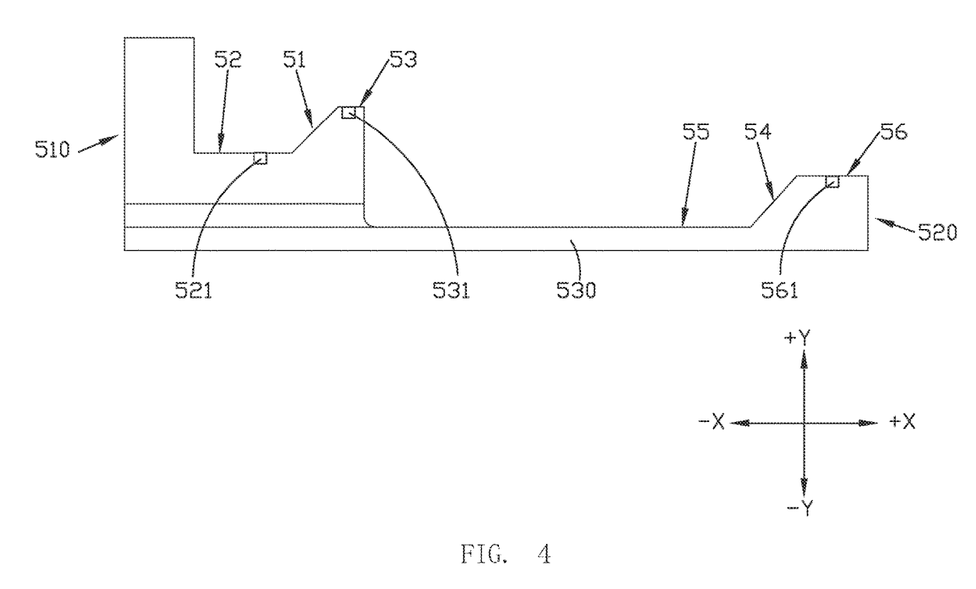
FIG. 4 is a schematic structural diagram of a second mounting frame in FIG. 2.

As shown in FIG. 3 and FIG. 4, the first mounting frame 4 is provided with a first fitting portion 41, and the second mounting frame 5 is provided with a second fitting portion 51. The first fitting portion 41 can abut against the second fitting portion 51. When the second mounting frame 5 moves along the second direction, the first mounting frame 4 can move along the first direction under the drive of the first fitting portion 41 and the second fitting portion 51.

Figure 5:
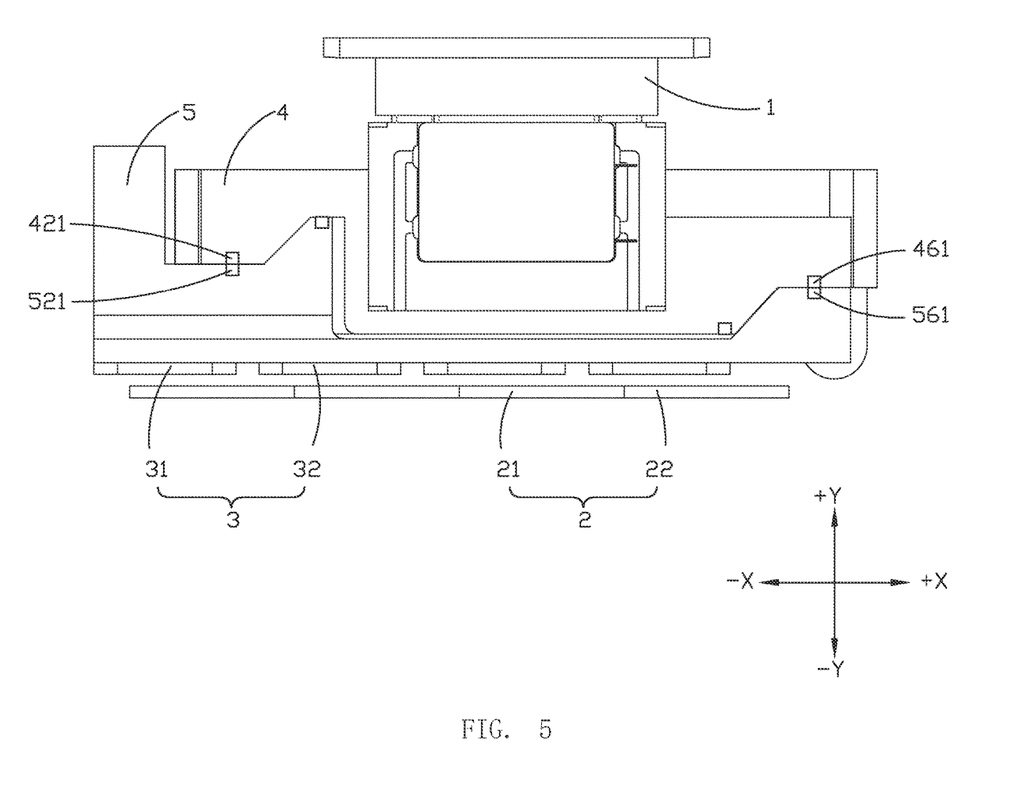
FIG. 5 is a schematic diagram when the lifting assembly of electronic equipment is in a stable state, wherein the lifting assembly of electronic equipment is in a retract state.
Figure 6:
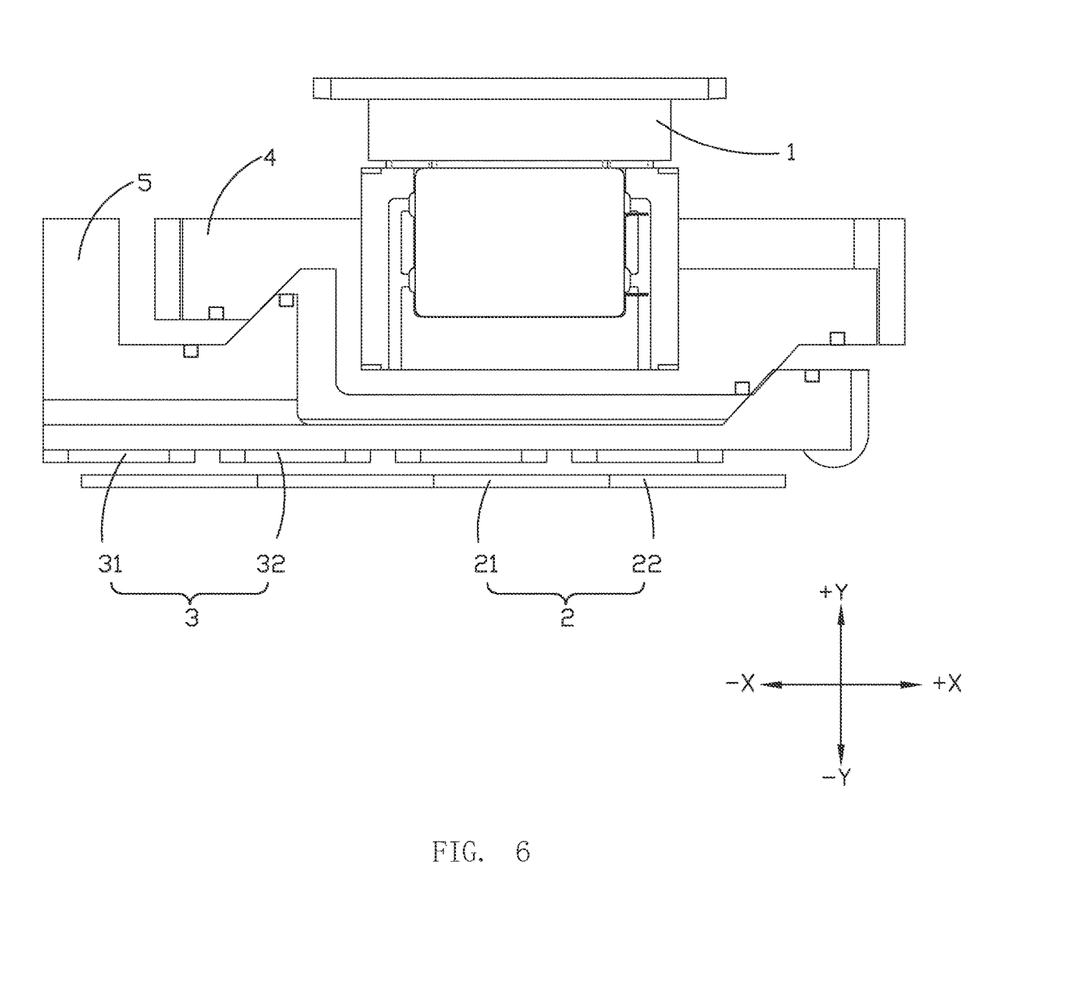
FIG. 6 is a schematic diagram when the lifting assembly of electronic equipment is in a moving state.
Figure 7:
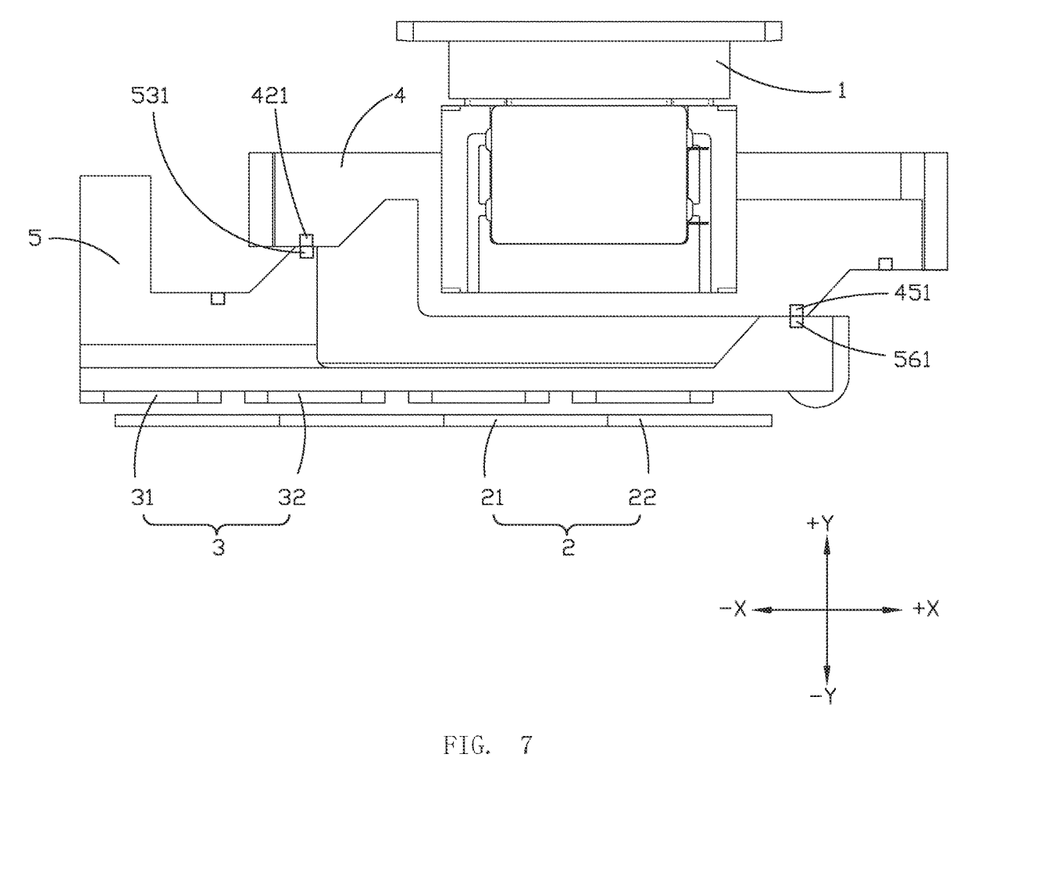
FIG. 7 is a schematic diagram when the lifting assembly of electronic equipment is in a stable state, wherein the lifting assembly of electronic equipment is in an extend state.

As shown in FIG. 5 to FIG. 7, when the second mounting frame 5 moves in a positive direction of the second direction X under the drive of the drive coil 3, the first fitting portion 41 abuts against the second fitting portion 51, and the first fitting portion 41 can move along the second fitting portion 51, so that the first mounting frame 4 moves along the first direction Y. By the arrangement of the first fitting portion 41 and the second fitting portion 51, the structures of the first mounting frame 4 and the second mounting frame 5 are simplified, thereby reducing the production cycles and production costs of the first mounting frame 4 and the second mounting frame 5, and reducing the number of parts required for the connection between the first mounting frame 4 and the second mounting frame 5. Therefore, a space inside the electronic equipment occupied by the first mounting frame 4 and the second mounting frame 5 is reduced, which is favorable for further reducing the overall dimension of the electronic equipment.

As shown in FIG. 3 and FIG. 4, the first mounting frame 4 includes a first fixing portion 42 and a second fixing portion 43. The first fixing portion 42 and the second fixing portion 43 are connected through the first fitting portion 41. A height difference exists between the first fixing portion 42 and the second fixing portion 43 along the first direction Y, that is, the first fixing portion 42, the first fitting portion 41 and the second fixing portion 43 are connected to form a Z-shaped structure. The second mounting frame 5 includes a first fixing fitting portion 52 and a second fixing fitting portion 53. The first fixing fitting portion 52 and the second fixing fitting portion 53 are connected through the second fitting portion 51. A height difference exists between the first fixing fitting portion 52 and the second fixing fitting portion 53 along the first direction Y, that is, the first fixing fitting portion 52, the second fitting portion 51 and the second fixing fitting portion 53 are connected to form a Z-shaped structure. When the lifting assembly is in a stable state, the first fixing portion 42 abuts against the first fixing fitting portion 52, or the first fixing portion 42 abuts against the second fixing fitting portion 53.

As shown in FIG. 5, when the lifting assembly is in a stable retract state, the first fixing portion 42 abuts against the first fixing fitting portion 52, and the second fixing portion 43 abuts against the second fixing fitting portion 53. As shown in FIG. 7, the first fixing portion 42 abuts against the second fixing fitting portion 53 when the lifting assembly is in a stable extend state. By the arrangement of the first fixing portion 42, the second fixing portion 43, the first fixing fitting portion 52 and the second fixing fitting portion 53, when the lifting assembly is in the stable state, the first mounting frame 4 and the second mounting frame 5 are in surface contact, which reduces the risk of damage caused by a small contact area or even point contact between the first mounting frame 4 and the second mounting frame 5, thus improving the service lives of the first mounting frame 4 and the second mounting frame 5. The service lives and working stability of the lifting assembly and the electronic equipment are improved.

As shown in FIG. 3 and FIG. 4, the first fixing portion 42 is provided with a first fixing part 421. The first fixing fitting portion 52 is provided with a first fixing fitting part 521. The second fixing fitting portion 53 is provided with a fourth fixing fitting part. As shown in FIG. 5, the first fixing part 421 fits the first fixing fitting part 521 when the first fixing portion 42 abuts against the first fixing fitting portion 52. As shown in FIG. 7, the first fixing part 421 fits the second fixing fitting part 531 when the first fixing portion 42 abuts against the second fixing fitting portion 53. Therefore, the risk of relative motion between the first mounting frame 4 and the second mounting frame 5 in mounting, transportation and use processes, so as to improve the stability of connection between the first mounting frame 4 and the second mounting frame 5 and improve the working stability of the lifting assembly.

The connection ways for the first fixing part 421 and the first fixing fitting part 521 as well as for the first fixing part 421 and the second fixing fitting part 531 include but are not limited to clamping and magnetic adsorption. In the embodiment of the present invention, the first fixing part 421 is connected with the first fixing fitting part 521 by magnetic adsorption, and the first fixing part 421 is connected with the second fixing fitting part 531 by magnetic adsorption. That is, if the first fixing part 421 is a second magnetic element, the first fixing fitting part 521 and the second fixing fitting part 531 are magnetic fitting parts. If the first fixing part 421 is a magnet, the first fixing fitting part 521 and the second fixing fitting part 531 are metal parts. Alternatively, if the first fixing part 421 is a metal part, the first fixing fitting part 521 and the second fixing fitting part 531 are magnet. Alternatively, if the first fixing part 421 is a magnet, one of the first fixing fitting part 521 and the second fixing fitting part 531 is a metal part, and the other one is a magnet with an opposite magnetism to that of the first fixing part 421. Alternatively, if the first fixing part 421 is a magnet, the first fixing fitting part 521 and the second fixing fitting part 531 are both magnets with opposite magnetisms to that of the first fixing part 421. The present invention does not make special restrictions on the specific structures and types of the first fixing part 421, the first fixing fitting part 521 and the second fixing fitting part 531.

As shown in FIG. 3, the first mounting frame 4 includes a first main body portion 430, and a first end portion 410 and a second end portion 420 which are oppositely arranged at two ends of the first main body portion 430 along the second direction X. A height difference exists between each of the first end portion 410 and the second end portion 420 and the first main body portion 430 along the first direction Y. The first fixing portion 42, the first fitting portion 41 and the second fixing portion 43 are all arranged at the first end portion 410.

The second end portion 420 is provided with a third fitting portion 44, a third fixing portion 45, and a fourth fixing portion 46. The third fixing portion 45 and the fourth fixing portion 46 are connected through the third fitting portion 44. A height difference exists between the first fixing portion 45 and the fourth fixing portion 46 along the first direction Y. The third fixing portion 45 is provided with a second fixing part 451, and the fourth fixing portion 46 is provided with a third fixing part 461.

As shown in FIG. 4, the second mounting frame 5 includes a second main body portion 530, and a third end portion 510 and a fourth end portion 520 which are oppositely arranged at two ends of the second main body portion 530 along the second direction X. A height difference exists between each of the third end portion 510 and the fourth end portion 520 and the second main body portion 530 along the first direction Y. The first fixing fitting portion 52, the second fitting portion 51 and the second fixing fitting portion 53 are all arranged at the third end portion 510.

The fourth end portion 520 is provided with a fourth fitting portion 54, a third fixing fitting part 55 and a fourth fixing fitting part 56. A height difference exists between the third fixing fitting part 55 and the fourth fixing fitting part 56 along the first direction Y. The third fixing fitting part 55 and the fourth fixing fitting part 56 are connected through the fourth fitting portion 54. The fourth fixing fitting part 56 is provided with a third fixing fitting part 561.

As shown in FIG. 5, when the first fixing portion 42 abuts against the first fixing fitting portion 52, the first main body portion 430 fits the second main body portion 530; the first fixing part 421 fits the first fixing fitting part 521; the fourth fixing portion 46 abuts against the fourth fixing fitting portion 56; and the third fixing part 461 fits the third fixing fitting part 561. As shown in FIG. 7, when the first fixing portion 42 abuts against the second fixing fitting portion 53, the first fixing part 421 fits the second fixing fitting part 531; the third fixing portion 45 abuts against the fourth fixing fitting portion 56; and the second fixing part 451 fits the third fixing fitting part 561.

Both the left and right sides of the first mounting frame 4 and the second mounting frame 5 are provided with the fixing portions, the fixing parts and the fixing fitting parts, so that when the lifting assembly is in the stable state, the first mounting frame 4 and the second mounting frame 5 can be loaded by the left and right sides at the same time, thus reducing the risk of tilting and damage caused by unilateral loads on the first mounting frame 4 and the second mounting frame 5. Therefore, the stability of connection between the first mounting frame 4 and the second mounting frame 5 is improved, and the service lives of the first mounting frame 4 and the second mounting frame 5 are prolonged.

The connection ways for the second fixing part 451 and the third fixing fitting part 561 as well as for the third fixing part 461 and the third fixing fitting part 561 include but are not limited to clamping and magnetic adsorption. In the embodiment of the present invention, the second fixing part 451 is connected with the third fixing fitting part 561 by magnetic adsorption, and the third fixing part 461 is connected with the third fixing fitting part 561 by magnetic adsorption. That is, if the second fixing part 451 and the third fixing part 461 are second magnetic elements, the third fixing fitting part 561 is a magnetic fitting part; and if the second fixing part 451 and the third fixing part 461 are magnets, the third fixing fitting part 561 is a metal part. Alternatively, if the second fixing part 451 and the third fixing part 461 are metal parts, the third fixing fitting part 561 is a magnet. Alternatively, if the third fixing fitting part 561 is a magnet, one of the second fixing fitting part 451 and the third fixing fitting part 461 is a metal part, and the other one is a magnet with an opposite magnetism to that of the third fixing fitting part 561. The present invention does not make special restrictions on the specific structures and types of the second fixing part 451, the third fixing part 461 and the third fixing fitting part 561.

As shown in FIG. 1 to FIG. 7, the drive coil 3 includes a first coil 31 and a second coil 32. The first coil 31 and the second coil 32 are alternately arranged along the second direction. The first magnetic element 2 includes a first magnetic body 21 and a second magnetic body 22. The first magnetic body 21 is arranged opposite to the first coil 31, and the second magnetic body 22 is arranged opposite to the second coil 32.

By the arrangement of a plurality of drive coils 3 and the first magnetic element 2, the number of load bearing positions of the second mounting frame 5 during the motion of the lifting assembly is increased, and the risk of tilting of the second mounting frame 5 due to local load bearing of the second mounting frame 5 is reduced, thus reducing the risk of interference between the lifting assembly and other parts in the electronic equipment, improving the motion stability of the lifting assembly, and prolonging the service lives of the lifting assembly and other parts in the electronic equipment.

A flow direction of current in the first coil 31 is the same as that of current in the second coil 32. At this time, the magnetism of the first magnetic body 21 is the same as that of the second magnetic body 22. The first magnetic body 21 and the second magnetic body 22 are spaced apart or integrally formed to improve the structural flexibility of the first magnetic element 2.

In the process of driving the lifting body 1 to move, the current modes in the first coil 31 and the second coil 32 are changed to change the directions of the Ampere forces generated by the first coil 31 and the second coil 32, so as to control the second mounting frame 5 to move in the positive or negative direction of the second direction X, and control the first mounting frame 4 to move in the positive or negative direction of the first direction Y, thus controlling the lifting assembly to extend or retract.

The flow direction of the current in the first coil 31 is opposite to that of the current in the second coil 32. At this time, the magnetism of the first magnetic body 21 is opposite to that of the second magnetic body 22. The first magnetic body 21 and the second magnetic body 22 are spaced apart.

In the process of driving the lifting body 1 to move, when power is made to the first coil 31, the first coil 31 generates an Ampere force in the positive direction of the second direction X, so as to drive the second mounting frame 5 to move in the positive direction of the second direction X, and then drive the first mounting frame 4 to move in the positive direction of the first direction Y. At this time, the lifting assembly extends. When power is made to the second coil 32, the second coil 32 generates an Ampere force in the negative direction of the second direction X, so as to drive the second mounting frame 5 to move in the negative direction of the second direction X, and then drive the first mounting frame 4 to move in the negative direction of the first direction Y. At this time, the lifting assembly retracts.

The flow direction of the current in the first coil 31 is opposite to the flow direction of the current in the second coil 32. It is only necessary to control the first coil 31 or the second coil 32 to be powered on or powered off to adjust the motion state of the lifting assembly, simplifying the control way of the lifting assembly and then simplifying the structure of the control assembly.

To sum up, when the lifting assembly is in a retract state, the lifting assembly at least partially retracts into the equipment body. At this time, as shown in FIG. 3, FIG. 4 and FIG. 5, the first fixing portion 42 abuts against the first fixing fitting portion 52; the second fixing portion 43 abuts against the second fixing fitting part 53; the first main body portion 430 abuts against the second main body portion 530; the fourth fixing portion 46 abuts against the fourth fixing fitting portion 56; and meanwhile, the first fixing part 421 fits the first fixing fitting part 521, and the third fixing part 423 fits the third fixing fitting part 532. When the drive coil 3 is powered on and generates the Ampere force in the positive direction of the second direction X, as shown in FIG. 6, the second mounting frame 5 moves in the positive direction of the second direction X under the drive of the drive coil 3; the first end portion 410 and the third end portion 510 move relatively; and the second end portion 420 and the fourth end portion 520 move relatively, so that the first fitting portion 41 and the second fitting portion 51 abut against each other. The first fitting portion 41 and the second fitting portion 51 move relatively, and the first mounting frame 4 moves in the positive direction of the first direction Y under the drive of the first fitting portion 41 and the second fitting portion 51. At this time, the lifting assembly extends. As shown in FIG. 7, when the first fixing portion 42 and the second fixing fitting portion 53 abut against each other, the first fitting portion 41 does not fit the second fitting portion 51, but the first fixing part 421 fits the second fixing fitting part 531, and the second fixing part 422 fits the third fixing fitting part 532. At this time, the lifting assembly completes the extending action and is stabilized in the extend state. When the drive coil 3 is powered on and generates the Ampere force along the negative direction of the second direction X, the second mounting frame 5 moves along the negative direction of the second direction X under the drive of the drive coil 3, so that the first fitting portion 41 and the second fitting portion 51 abut against each other again; the first fitting portion 41 and the second fitting portion 51 move relatively; and the first mounting frame 4 moves along the negative direction of the first direction Y. At this time, the lifting assembly retracts.

The implementation modes of the present invention are described above only. It should be noted that those of ordinary skill in the art can further make improvements without departing from the concept of the present invention. These improvements shall all fall within the protection scope of the present invention.

What is claimed is:

1. A lifting assembly of electronic equipment, the lifting assembly of the electronic equipment comprising a first mounting frame, a second mounting frame, a lifting body, a drive coil, and a first magnetic element, wherein the first mounting frame and the second mounting frame are oppositely arranged along a first direction, and the first mounting frame and the second mounting frame are movably connected;

the lifting body is mounted on the first mounting frame;

the drive coil is mounted on the second mounting frame;

the first magnetic element is relatively arranged on one side of the drive coil away from the second mounting frame along an axial direction of the drive coil;

after power is made to the drive coil, the drive coil drives the second mounting frame to move along the second direction under the drive of the first magnetic element; at the same time, the second mounting frame drives the first mounting frame to move along the first direction to cause the lifting body moves along the first direction; and a preset included angle exists between the first direction and the second direction.

2. The lifting assembly of the electronic equipment according to claim 1, wherein the first mounting frame comprises a first fixing part; the second mounting frame at least comprises a first fixing fitting part and a second fixing fitting part which are spaced apart;

when the lifting assembly of electronic equipment is in a stable state, the first fixing part fits the first fixing fitting part, or the first fixing part fits the second fixing fitting part.

3. The lifting assembly of the electronic equipment according to claim 2, wherein the first mounting frame comprises a first fixing portion, a second fixing portion, and a first fitting portion for connecting the first fixing portion with the second fixing portion; the second mounting frame comprises a first fixing fitting portion, a second fixing fitting portion, and a second fitting portion for connecting the first fixing fitting portion with the second fixing fitting portion; the first fitting portion abuts against the second fitting portion;

when the second mounting frame moves along the second direction, the first fitting portion and the second fitting portion move relatively to cause the first mounting frame to move along the first direction.

4. The lifting assembly of the electronic equipment according to claim 3, wherein a height difference exists between the first fixing portion and the second fixing portion along the first direction;

a height difference exists between the first fixing fitting portion and the second fixing fitting portion along the first direction;

when the lifting assembly of electronic equipment is in the stable state, the first fixing portion abuts against the first fixing fitting portion, or the first fixing portion abuts against the second fixing fitting portion.

5. The lifting assembly of the electronic equipment according to claim 4, wherein the first fixing part is arranged to the first fixing portion; the first fixing fitting part is arranged to the first fixing fitting portion; the second fixing fitting part is arranged to the second fixing fitting portion;

the first fixing part fits the first fixing fitting part when the first fixing portion abuts against the first fixing fitting portion; and the first fixing part fits the second fixing fitting part when the first fixing portion abuts against the second fixing fitting portion.

6. The lifting assembly of the electronic equipment according to claim 4, wherein the first mounting frame comprises a first main body portion, and a first end portion and a second end portion which are oppositely arranged at two ends of the first main body portion along the second direction; the first fitting portion, the first fixing portion and the second fixing portion are all arranged at the first end portion;

the second mounting frame comprises a second main body portion, and a third end portion and a fourth end portion which are oppositely arranged at two ends of the second main body portion along the second direction; the second fitting portion, the first fixing fitting portion and the second fixing fitting portion are all arranged at the third end portion;

along the first direction, a height difference exists between each of the first end portion and the second end portion and the first main body portion, and a height difference exists between each of the third end portion and the fourth end portion and the second main body portion; the first main body portion fits the second main body portion;

when the second mounting frame moves along the second direction, the first end portion and the third end portion move relatively, and the second end portion and the fourth end portion move relatively.

7. The lifting assembly of the electronic equipment according to claim 6, wherein the second end portion is provided with a third fitting portion, a third fixing portion and a fourth fixing portion; the third fixing portion is connected with the fourth fixing portion through the third fitting portion; a height difference exists between the third fixing portion and the fourth fixing portion along the first direction;

the fourth end portion is provided with a fourth fitting portion, a third fixing fitting portion and a fourth fixing fitting portion; the third fixing fitting portion is connected with the fourth fixing fitting portion through the fourth fitting portion; a height difference exists between the third fixing fitting portion and the fourth fixing fitting portion along the first direction;

the third fitting portion and the fourth fitting portion move relatively when the second mounting frame moves along the second direction;

when the lifting assembly of electronic equipment is in the stable state, the fourth fixing portion abuts against the fourth fixing fitting portion, or the third fixing portion abuts against the fourth fixing fitting portion.

8. The lifting assembly of the electronic equipment according to claim 7, wherein the first mounting frame further comprises a second fixing part and a third fixing part; the second fixing part is arranged to the third fixing portion; the third fixing part is arranged to the fourth fixing portion;

the second mounting frame further comprises a third fixing fitting part, and the third fixing fitting part is arranged to the fourth fixing fitting portion; and  when the lifting assembly of electronic equipment is in the stable state, the second fixing part fits the third fixing fitting part, or the third fixing part fits the third fixing fitting part.

9. The lifting assembly of the electronic equipment according to claim 8, wherein the first fixing part, the second fixing part, the third fixing part, the first fixing fitting part, the second fixing fitting part, and the third fixing fitting part are all magnetic elements.

10. An electronic equipment, the electronic equipment comprising:

an equipment body; and the lifting assembly of electronic equipment according to claim 1, wherein the lifting assembly of electronic equipment is mounted on the equipment body; the lifting assembly of electronic equipment at least partially extends out of the equipment body; and  the equipment body further comprises a limiting structure capable of limiting the lifting assembly of electronic equipment from moving along the first direction and/or the second direction.

\* \* \* \* \*